United States Patent [19]
Johnson et al.

[11] Patent Number: 6,144,559
[45] Date of Patent: Nov. 7, 2000

[54] PROCESS FOR ASSEMBLING AN INTERPOSER TO PROBE DENSE PAD ARRAYS

[75] Inventors: Kenneth W Johnson; Thomas J Zamborelli; Larry Bartosch, all of Colorado Springs, Colo.

[73] Assignee: Agilent Technologies, Palo Alto, Calif.

[21] Appl. No.: 09/288,343

[22] Filed: Apr. 8, 1999

[51] Int. Cl.⁷ ........................................ H05K 1/18
[52] U.S. Cl. .................. 361/760; 361/818; 361/820; 361/825; 361/803; 324/750; 439/68; 439/69; 174/255; 174/52.1
[58] Field of Search ................... 361/760, 818, 361/820, 825–827, 766, 803; 324/754, 755, 750, 765, 527; 439/496, 68, 69; 174/255, 52.1

[56] References Cited

U.S. PATENT DOCUMENTS

| | | | |
|---|---|---|---|
| 4,554,505 | 11/1985 | Zachry | 324/158 F |
| 4,835,469 | 5/1989 | Jones et al. | 324/158 F |
| 4,853,626 | 8/1989 | Resler | 324/158 F |
| 5,460,531 | 10/1995 | Vivio | 439/70 |
| 5,515,241 | 5/1996 | Werther | 361/784 |
| 5,847,572 | 12/1998 | Iwasaki et al. | 324/755 |
| 5,854,534 | 12/1998 | Beilin et al. | 257/691 |
| 5,859,538 | 1/1999 | Self | 324/755 |
| 5,896,037 | 4/1999 | Kudla et al. | 324/755 |
| 5,926,027 | 7/1999 | Bumb, Jr. et al. | 324/755 |
| 5,939,891 | 8/1999 | Kishi et al. | 324/755 |

*Primary Examiner*—Jeffrey Gaffin
*Assistant Examiner*—David Foster

[57] ABSTRACT

Disclosed is a process to manufacture an interposer which includes an interposer socket assembly to use in probing dense pad arrays that minimizes the associated extraneous pin loading and cross-talk caused by a probe tip. The process comprises the steps of: mounting a number of resistors onto a number of predetermined positions in a pad array on an interposer board; inserting a number of interposer pins of a pin socket into the pads of the pad array on the interposer board, wherein the ends of the interposer pins protrude through the interposer board; placing a solder preform around the ends of the interposer pins; and, heating the solder preforms in a solder re-flow oven to solder the interposer pins to the respective pads of the pad array.

12 Claims, 8 Drawing Sheets

6,144,559

PROCESS FOR ASSEMBLING AN INTERPOSER TO PROBE DENSE PAD ARRAYS

CROSS-REFERENCE TO RELATED APPLICATIONS

This application related to copending U.S. patent application entitled "System and Method for Probing Dense Pad Arrays" (Attorney Docket No. 10981416-1) filed on even date herewith and accorded U.S. Ser. No. 09/088,370, and to copending U.S. patent application entitled "Split Resistor Probe and Method" (Attorney Docket No. 10980939-1) filed on even date herewith and accorded U.S. Ser. No. 09/288,347, both of which are incorporated herein by reference.

TECHNICAL FIELD

The present invention is generally related to process for manufacturing test equipment and, more particularly, is related to a process for assembling an interposer.

BACKGROUND OF THE INVENTION

Integrated circuits such as processors and other similar devices are operating at much greater speeds to perform an ever increasing number of operations each second. Many of these integrated circuits are placed on printed circuit boards or other similar structures and are in electrical communication with many different electrical components and other integrated circuits resident on the same printed circuit board. In order to facilitate communication between the integrated circuits and the several other electronic components, the integrated circuit contacts electrical conductors on a printed circuit board through pads that are often arranged in a dense grid or array on the printed circuit board.

Oftentimes, it is necessary to test the operation of such new integrated circuits after they are fabricated either to test prototypes or to diagnose problems experienced with the integrated circuits. In particular, generally one or more of the pads in the array into which the integrated circuit is inserted are probed to access the signal thereon so that the signal can be transmitted to a logic analyzer or oscilloscope. The fact that the pins of the integrated circuits and corresponding pads on the printed circuit board are arranged in a dense array make such testing difficult to accomplish in light of the high frequency operation of such integrated circuits.

To explain further, a typical printed circuit board includes several groups of signal conductors that run between various components on the board. When a probe conductor is joined to one of the pads, a very small capacitance between the probe conductor and the signal conductors on the order of picofarads presents an undesirable load impedance on the pads. In particular, at low frequencies, this impedance is acceptably high. However, at very high signal frequencies on the order of hundreds of megahertz, the impedance presented by such a capacitance will drop, resulting in extraneous loading on the conductors between the integrated circuits.

In addition, a similar small capacitance may exist between the probe conductor and the remaining pads, or aggressor pads in the pad array. At high frequencies, these capacitances present a low impedance which results in cross-talk between the aggressor pads and the probe conductor.

This extraneous loading and cross-talk results in distortion of the signal on the pins of the integrated circuit that causes error to the data represented by the transmitted signals. Consequently, the ability to test the integrated circuit is hampered by the use of the probe itself.

SUMMARY OF THE INVENTION

In light of the foregoing, the present invention provides for a process to manufacture an interposer which includes an interposer socket assembly to use in probing dense pad arrays that minimizes the associated extraneous pin loading and cross-talk discussed above. The process of the present invention comprises the steps of: mounting a number of resistors onto a number of predetermined positions in a pad array on an interposer board; inserting a number of interposer pins of a pin socket into the pads of the pad array on the interposer board, wherein the ends of the interposer pins protrude through the interposer board; placing a solder preform around the ends of the interposer pins; and, heating the solder preforms in a solder re-flow oven to solder the interposer pins to the respective pads of the pad array.

The present invention may also be viewed as a process for assembling a ball grid array assembly on a printed circuit board, comprising the steps of: mounting a number of resistors onto a number of predetermined positions in a pad array on the printed circuit board; placing a ball grid array assembly onto the pad array; and, heating a number of solder balls on the ball grid array assembly in a solder re-flow oven to solder the ball grid array assembly to the pad array.

The present invention provides distinct advantages in that, for example, a number of resistors may be easily positioned among interposer pins which protrude from a dense pad array by putting the resistors in place before the interposer pins are put into place. Thus, the resistors can be employed to address the problems of extraneous pin loading and cross-talk without interfering with or otherwise damaging the interposer pins themselves. Also, the present process prevents solder from being deposited on contact regions of the interposer pins as well. Other advantages of the invention include the fact that the processes are simple in design, user friendly, efficient, and easily implemented for mass commercial production.

Other features and advantages of the present invention will become apparent to one with skill in the art upon examination of the following drawings and detailed description. It is intended that all such additional features and advantages be included herein within the scope of the present invention.

BRIEF DESCRIPTION OF THE SEVERAL VIEWS OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

Figure 1:
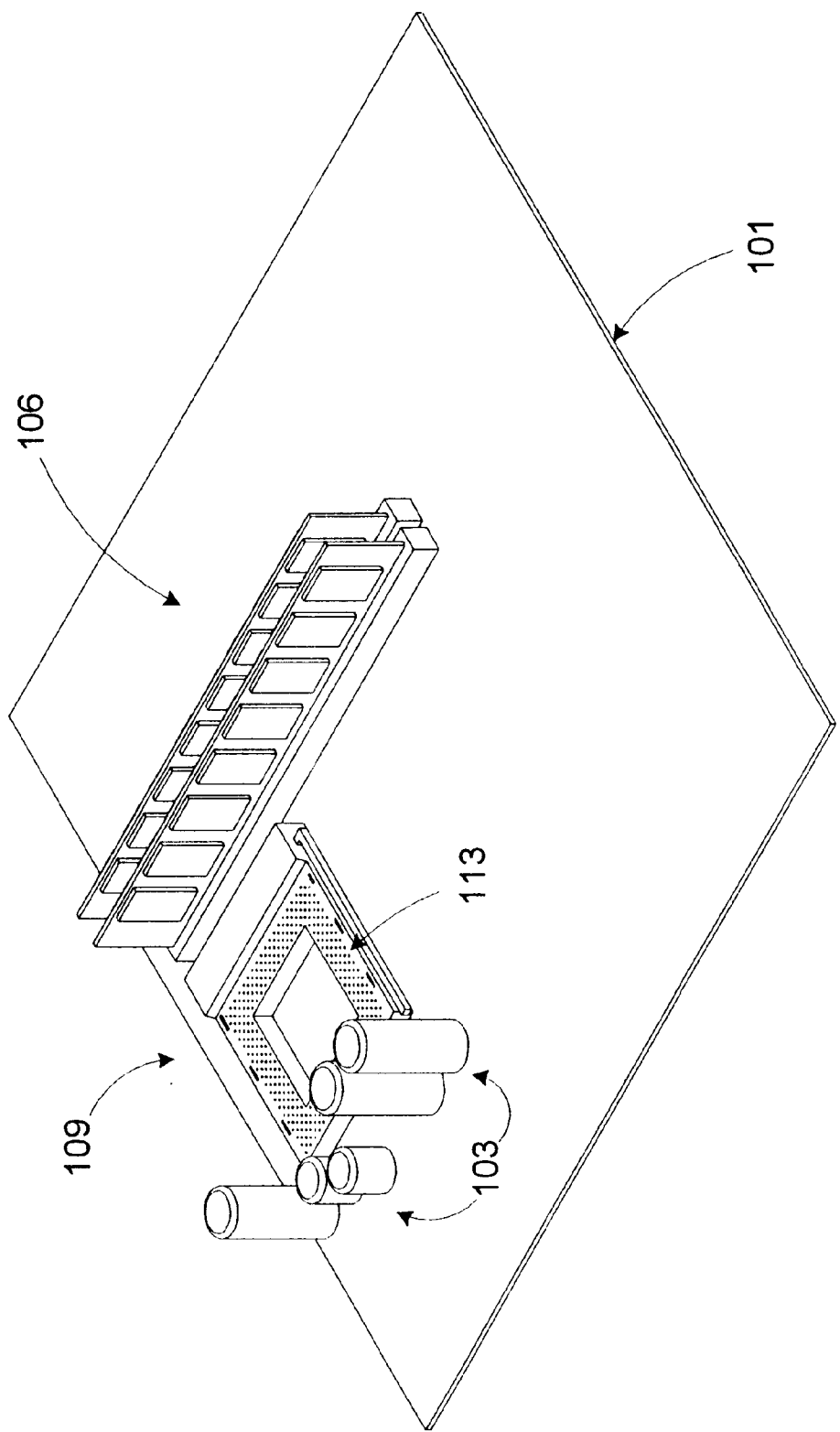
FIG. 1 is a perspective view of a printed circuit board having a socket to receive a processor.

Turning to FIG. 1, shown is a printed circuit board 101 as used in many personal computers on which is mounted a few representative capacitors 103 and a memory bank 106. Also, the printed circuit board 101 includes a socket 109 into which a processor may be inserted. The socket 109 includes a grid of holes which are arranged to receive a processor (not shown). The holes are placed relatively close together. When a processor fitted into the socket 109, it is quite difficult to access the innermost pins of the processor for diagnostic purposes. One such means to provide the needed access to the processor pins is to use an interposer which is placed between the processor and the socket 109.

Figure 2:
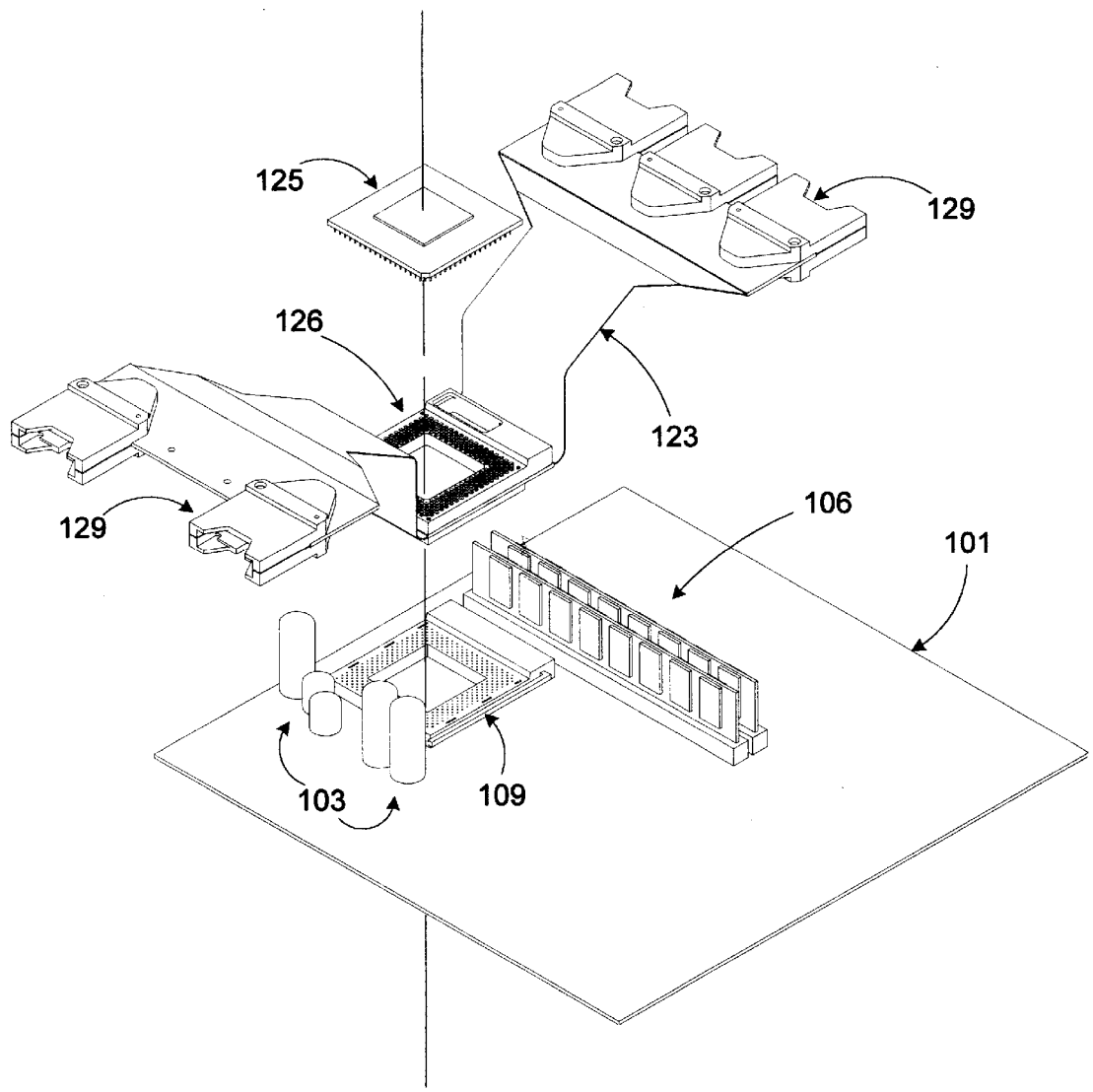
FIG. 2 is an exploded perspective view of the printed circuit board of FIG. 1 with an interposer socket assembly and an integrated circuit.

With reference to FIG. 2, shown is an exploded perspective view of an interposer 123 that is plugged into the socket 109 on the printed circuit board 101 when in use. A processor 125 in turn is plugged into the interposer 123 as shown. The interposer 123 includes an interposer socket assembly 126 which is adapted to mate with the socket 109. In particular, the socket assembly 126 includes a number of interposer pins that protrude from the bottom in a pin grid array (not shown) which mimics the pins of a processor that normally is plugged into the socket 109. Each of the interposer pins is coupled to a probe tip which includes probe tip resistors (not shown). The interposer 123 also includes electrical connectors 129 which allow diagnostic equipment to be electrically coupled to the individual pins in the interposer socket assembly 126. The individual probe tips extend from their respective interposer pins to a contact point in one of the electrical connectors 129. The diagnostic equipment may include, for example, and oscilloscope or logic analyzer.

Figure 3:
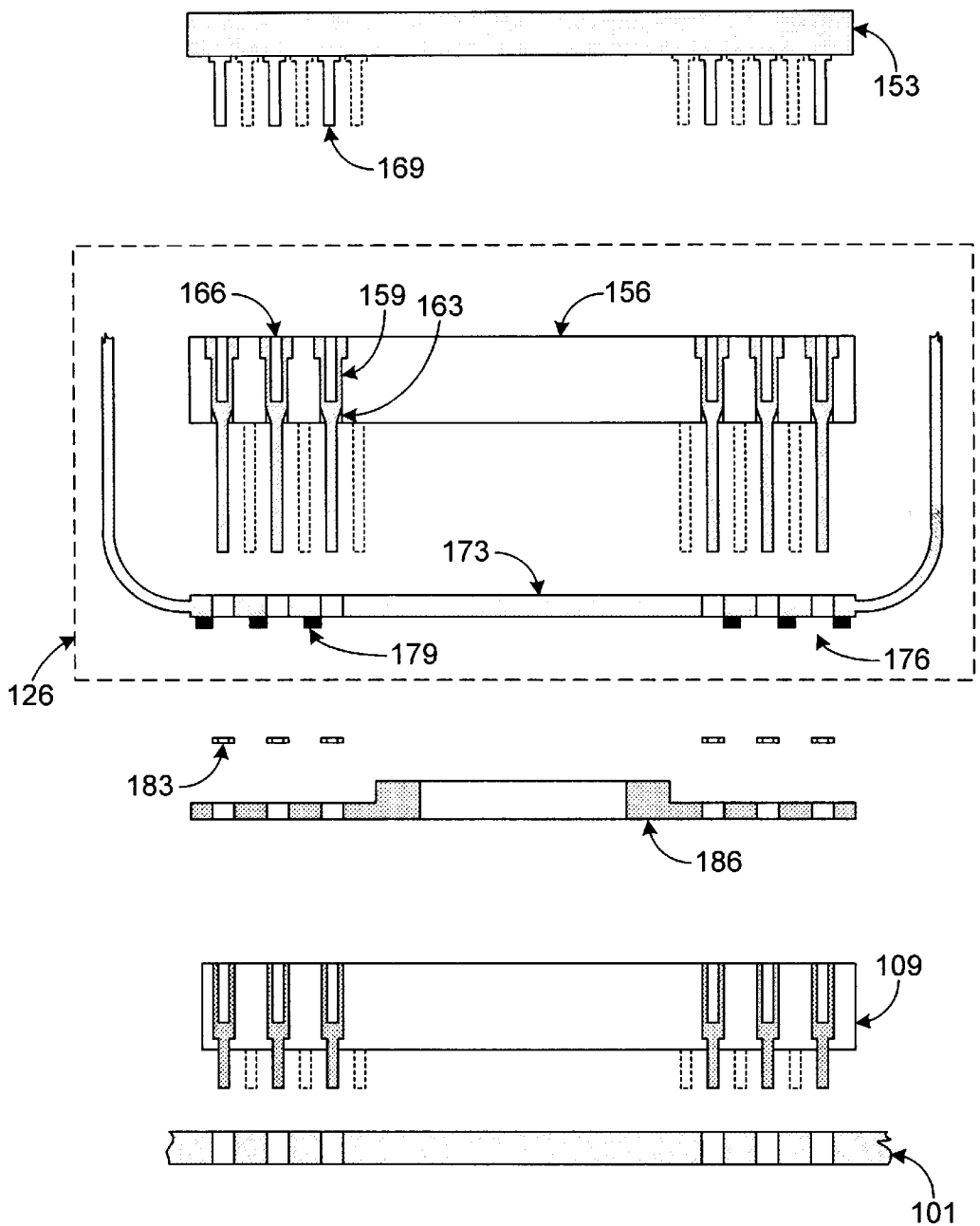
FIG. 3 is an exploded side view of the printed circuit board, socket, and interposer socket assembly of FIGS. 1 and 2 and a processor to be plugged in to the interposer socket assembly.

Referring next to FIG. 3, shown is an exploded side view of the printed circuit board 101, the socket 109, the interposer socket assembly 126, and a processor 153. The interposer socket assembly 126 includes a pin socket 156 which includes a number of interposer pins 159. Note that not all of the interposer pins 159 are shown in order to keep the drawing from looking too complex and difficult to read. The interposer pins 159 are pressed into holes 163 in the pin socket 156. On one end, the interposer pins 159 include a female electrical contact 166 in which the processor pins 169 are inserted.

The interposer socket assembly 126 also includes an interposer board 173 which includes a pad array 176 with a number of resistors 179. The pad array 176 is similar to the pad arrays described in copending U.S. Patent Application entitled "System and Method for Probing Dense Pad Arrays" (Attorney Docket No. 10981416-1) filed on even date herewith and accorded U.S. Ser. No. 09/088,370, and which is incorporated herein by reference in its entirety. The pad array 176 may also be similar to the pad arrays described in copending U.S. Patent Application entitled "Split Resistor Probe and Method" (Attorney Docket No. 10980939-1) filed on even date herewith and accorded U.S. Ser. No. 09/288,347, and which is incorporated herein by reference in its entirety. The interposer pins 159 are soldered to the pads of the pad array 176 using a number of solder preforms 183. Finally, a resistor shield 186 is attached to the interposer board 173 to protect the resistors 179 as will be discussed.

Figure 4:
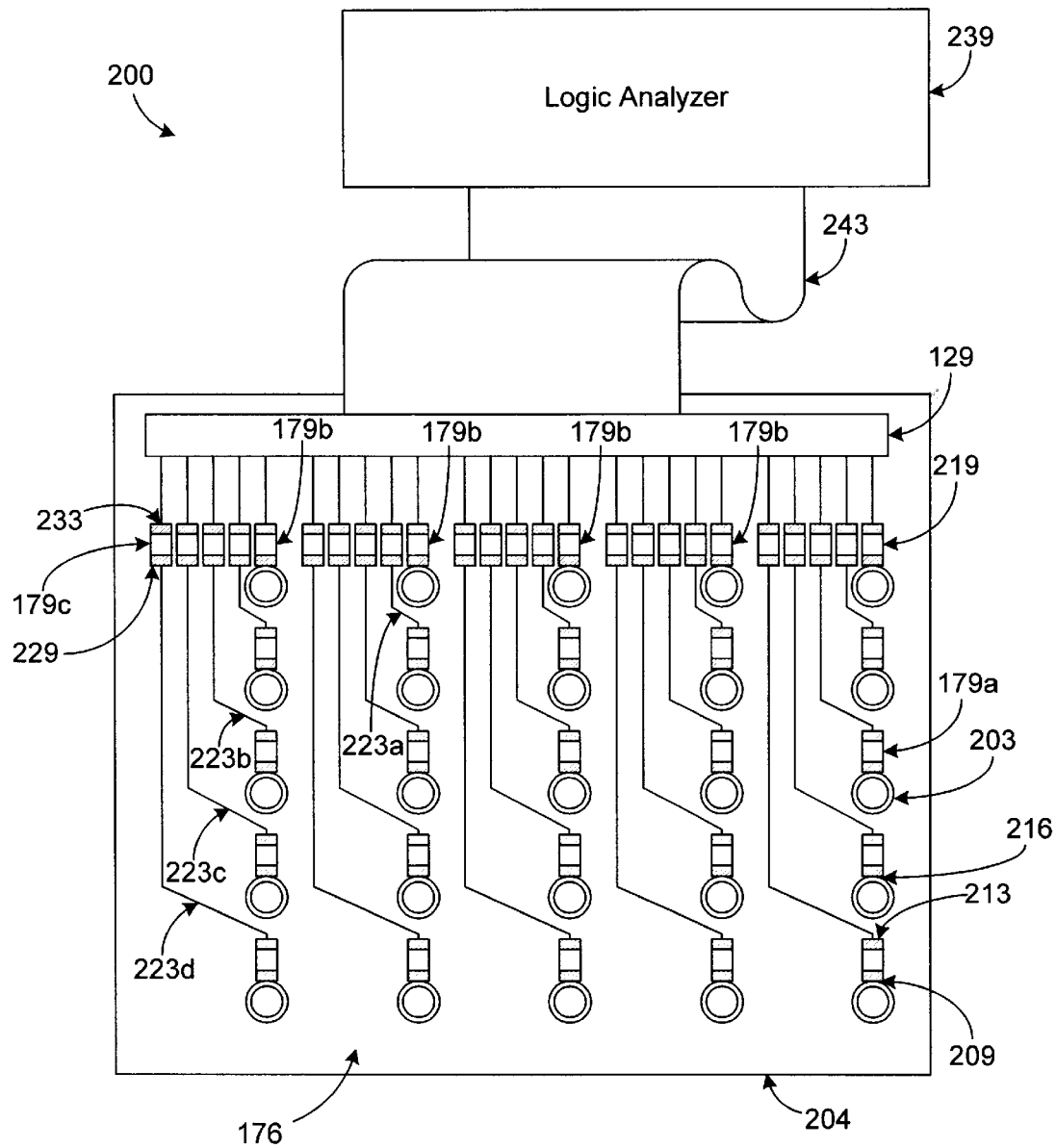
FIG. 4 is a drawing providing an illustration of a pad array employed in the interposer socket assembly of FIG. 2.

Turning to FIG. 4, shown is a top view of a pad array probing system 200 which provides a further illustration of the pad array 176. The pad array probing system 200 includes a dense pad array 176 which comprises a grid of pads 203 which are conductive holes that extend through a printed circuit board 204 or other similar flat surface member. The pads 203 are generally suited to receive the pins of a socket, an integrated circuit or other electronic device. In addition, the dense pad array 176 may also be a ball grid array, a pin grid array, an array of vias on a printed circuit board, a number of closely aligned conductors on a printed circuit board, or multi-chip module. The dense pad array 176 further includes a number of first probe tip resistors 179a which have a first end 209 and a second end 213. The first end 209 of each probe tip resistor 179a is electrically coupled to a respective pad 203, forming a predetermined coupling length 216 between the first ends 209 of the first probe tip resistors 179a and the pads 203, respectively. The predetermined coupling length 216 is as short as possible such that the first probe tip resistors 179a are directly adjacent to the pads 203, which is generally as short as manufacturing processes will allow. Note that the uppermost pads 203 are coupled to an external probe tip resistor 179b as shown.

The dense pad array 176 further includes a number of transmission lines 223a, 223b, 223c, and 223d. The transmission lines 223a–d are routed from the second ends 213 of the first probe tip resistors 179a out of the dense pad array 176 to a number of second probe tip resistors 179c. The second probe tip resistors 179c include a first end 229 and a second end 233. The transmission lines 223a–d are coupled to the first end 229 of the second probe tip resistor 179c. The second ends 233 of the second probe tip resistors 179c are electrically coupled to a connector 129 which in turn is electrically coupled to a logic analyzer 239 or oscilloscope (not shown) via a cable 243. Although the transmission lines 223a–d are generally shown exiting the dense pad array 176 in a uniform manner, it is possible that the transmission lines 223a–d follow any particular pathway in any convenient direction out of the dense pad array 176 based on various considerations. For example, it may be preferable to minimize the length of the transmission lines 223a–d to limit interference at high frequencies, or manufacturing limitations may dictate the actual routes employed out of the dense pad array 176. Also, the placement of the pads 203 may limit the possible exit routes for a particular pad 203 out of the dense pad array 176. Additionally, although the transmission lines 223a–d are shown only on the top side of the printed circuit board 204, it is possible that the transmission lines 223a–d be placed on either side of the printed circuit board 204 or a combination thereof using vias which route the transmission lines 223a–d through the printed circuit board 204.

The functionality of the dense pad array 176 is as follows. An integrated circuit such as a processor may have several pins which are generally lodged into each pad 203 in the pad array 176. The pads 203 are also electrically coupled to other integrated circuits and various components on the printed circuit board 101. Signals propagate between the integrated circuit attached to the pad arrays 176 and other components on the printed circuit board 204 during the operation of the overall circuit on the printed circuit board 101.

The first probe tip resistors 179a, transmission lines 223a–d, and second probe tip resistors 179c are employed to access the signals propagated on the pads 203 of the dense pad arrays 176 in order to test the operation of the integrated circuit attached to the dense pad arrays 176. Note that the first and second probe tip resistors 179a and 179c are called "probe tip" resistors because they are located at the tip of what is considered a probe applied to each of the pads 203. In particular, a signal propagated on the pads 203 is also transmitted through the first probe tip resistors 179a, along the transmission lines 223a–d, and through the second probe tip resistors 179c to the logic analyzing device 139 or other similar diagnostic equipment. The placement of the first probe tip resistors 179a with their first ends 209 as close as possible to the pads 203 reduces the loading of the pads 203 which would otherwise occur if there were no probe tip resistor 179a coupling the transmission lines 223a–d to the respective pads 203 within the dense pad array 176. The same is true regarding the external probe tip resistors 179b in which the electrical coupling to the connector 139 may cause the loading of the respective pads 203 to which the external probe tip resistors 179b are coupled. In addition, the second probe tip resistors 179c are coupled to the transmission lines 223a–d at a point outside of the dense pad array 176 to reduce the effects of cross-talk between the pads 203 and the transmission lines 223a–d due to a capacitance between any one of the pads 203 and a transmission line 223a–d which is routed near the respective pad 203.

Figure 5A:
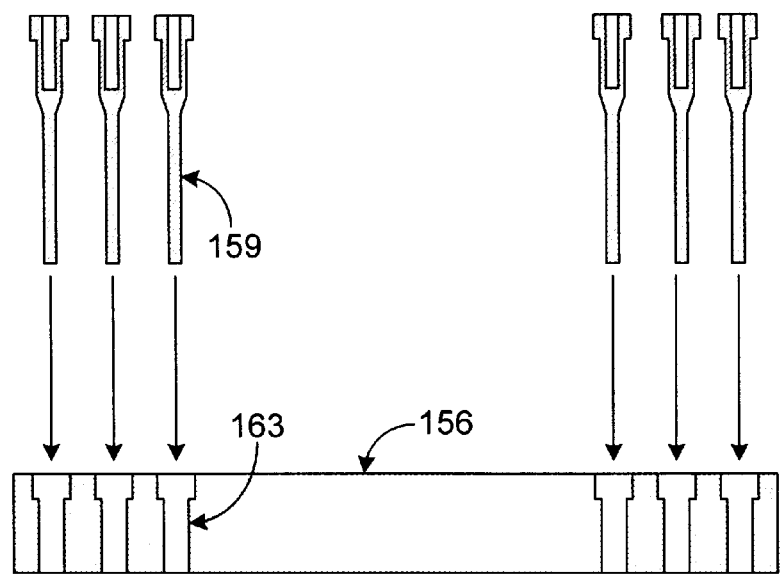
FIG. 5A is an exploded side view of the assembly of a pin socket used in the interposer socket assembly of FIG. 3.

Turning to FIGS. 5A–5F, shown are a number of side views which illustrate the process by which the interposer socket assembly 126 is assembled. First, as shown in FIG. 5A, the interposer pins 159 are inserted into the holes 163 in the pin socket 156. This may be performed by manually inserting and pressing the interposer pins 159 into the holes 163 or by using, for example, a vibratory feeder. The holes 163 have a diameter that is slightly smaller than the diameter of the interposer pins 159 which allows the interposer pins 159 to be pressed into and retained by the pin socket 156 with the thin ends of the interposer pins 159 protruding from the pin socket 156.

Figure 5B:
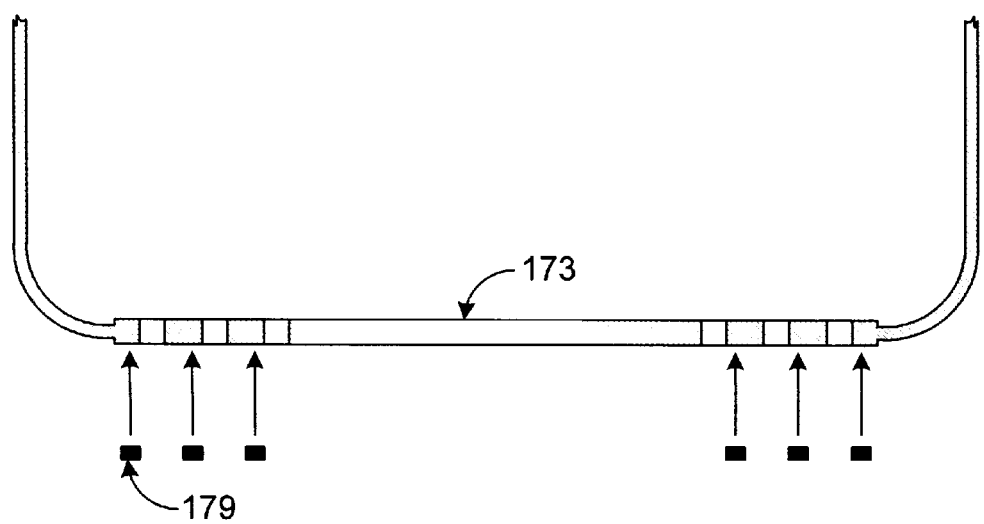
FIG. 5B is an exploded side view of the mounting of resistors to a pad array on an interposer board of the interposer socket assembly of FIG. 3.

Next, as shown in FIG. 5B, a number of resistors 179 are soldered to the pad array 176 on the interposer board 173 as discussed previously. The resistors 179 may mounted to the interposer board 173 by simply soldering the resistors 179 into place. This may be accomplished, for example, using double tipped soldering equipment (not shown) in a manual or automated process. For example, the resistors 179 may be placed using any industry standard pick-and-place surface mount assembly equipment. The resistors 179 may also be mounted to the interposer board 173 using some sort of adhesive such as an epoxy which would prevent the occurrence of "tomb stoning" by the resistors 179, which is described in later text. For example, the epoxy may be dispensed automatically using any industry standard dispensing machine.

Figure 5C:
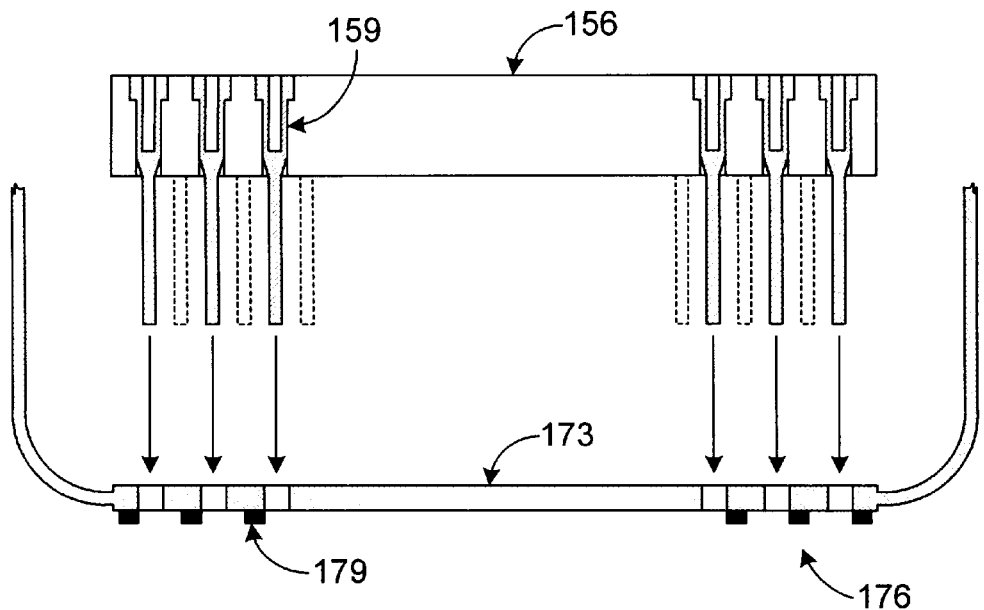
FIG. 5C is an exploded side view of the insertion of the interposer pins of the pin socket through the interposer board of the interposer socket assembly of FIG. 3.
Figure 5D:
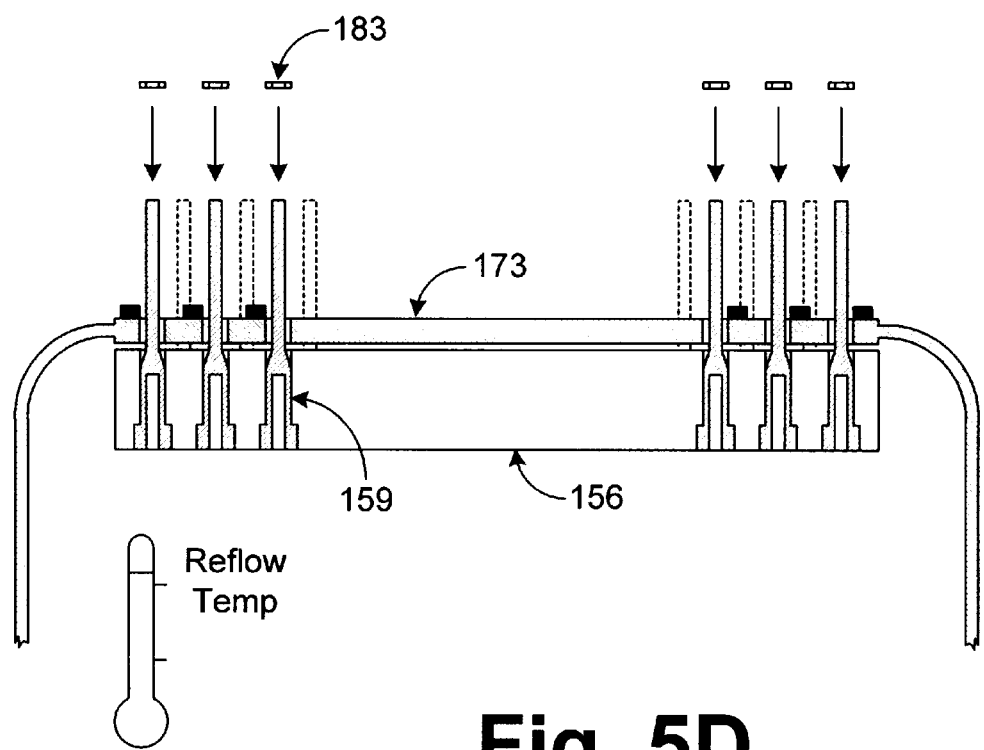
FIG. 5D is an exploded side view of the placement of the solder preforms onto the protruding interposer pins of FIG. 3.

The next step in the process is shown in FIG. 5C in which the interposer pins 159, now an integral part of the pin socket 156 are inserted into the grid of pads of the pad array 176. This may be performed manually or using automated positioning equipment. The interposer pins 159 thus extend through and protrude from the interposer board 173 and the corresponding pad array 176. Then, as shown in FIG. 5D, the solder preforms 183 are placed over the narrow ends of the protruding interposer pins 159 and fall flat against the interposer board 173. This step may be accomplished by manually placing the solder preforms 183 over the interposer pins 159 or by placing the solder preforms 183 over the interposer pins 159 using a fixture that places multiple preforms over multiple pins at the same time. Thereafter, the assembled interposer board 173 and pin socket 156 are placed in a solder re-flow oven and heated until the solder preforms 183 flow. Note that in some cases, if the size of the resistors 179 is very small, then the additional flow of solder from the solder preforms 183 may cause the resistors 179 to stand up on end due to the attraction to the greater amount of liquid solder. This is known as the "tomb stoning" effect which refers to the fact that the resistors 179 stand up on end like a tombstone.

When the assembled interposer board 173 and pin socket 156 are taken from the solder re-flow oven, the solder between the interposer pins 159 and the pads of the pad array 176 hardens, thereby fixing the interposer pins 159 to the pad array 176. Once the interposer pins 159 are soldered to the pads of the pad array 176, the resulting assembly may be employed to probe dense pad arrays as part of the interposer 123.

Figure 5E:
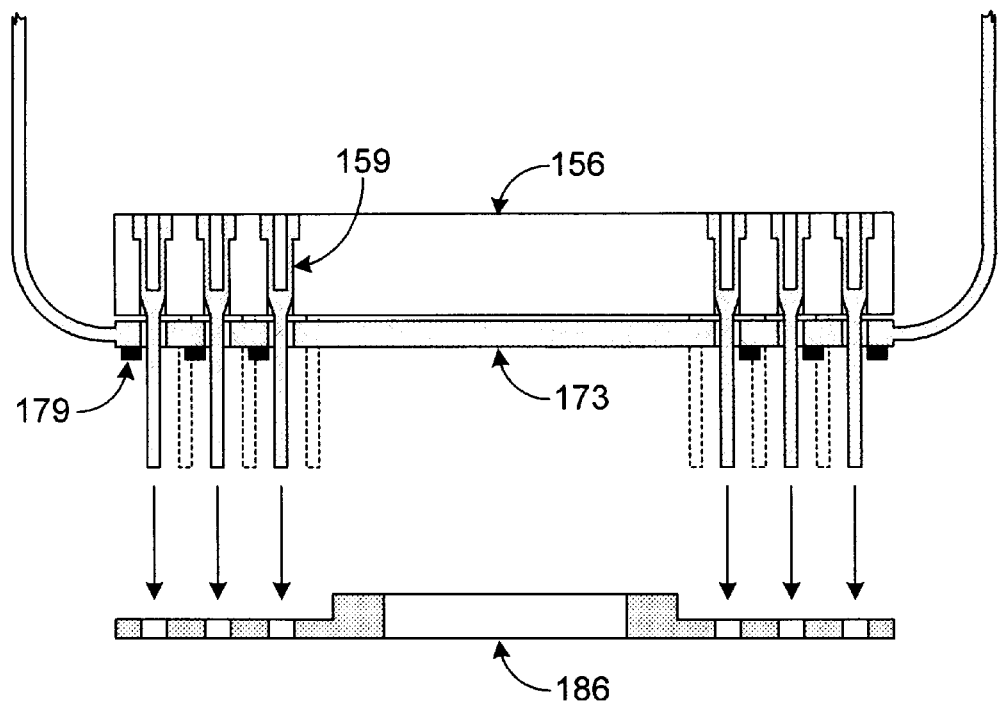
FIG. 5E is an exploded side view of the attachment of the resistor shield over the resistors in the interposer socket assembly of FIG. 3.

With reference to FIG. 5E, an optional step in the process to assemble the interposer socket assembly 126 is shown. In particular, the interposer pins 159 protruding from a pad array 176 are inserted into the grid of holes in the resistor shield 186 which is then attached to the interposer board 173 using suitable adhesive. The placement of the interposer pins 159 into the holes of the resistor shield 186 may be accomplished manually or using automated positioning equipment.

Figure 5F:
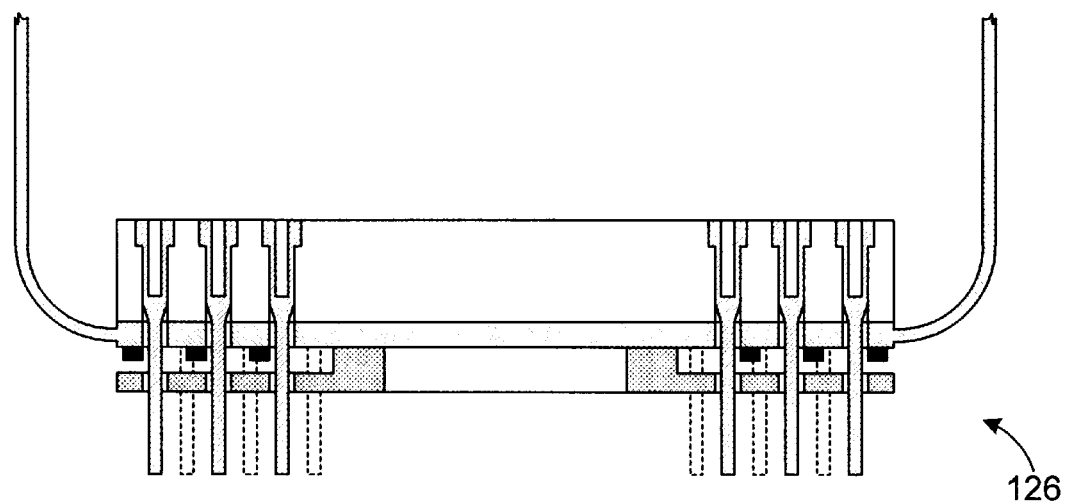
FIG. 5F is a side view of the assembled interposer socket assembly of FIG. 3.

The resistor shield 186 guards against electrostatic discharge and protects that resistors 179 from being disturbed. Also, the resistor shield 186 insulates the resistors from random conductors on the socket 109 into which the interposer 123 is inserted and prevents the interposer pins 159 from being crammed too far into the socket 109. In addition, the resistor shield 186 helps maintain the parallel nature of the interposer pins 159. FIG. 5F shows the assembled interposer socket assembly 126 with the resistor shield 186.

The present process of assembling the interposer socket assembly 126 is advantageous due to the fact that it allows the resistors 179 to be mounted within the pad array 176 without disturbing, deforming, or depositing solder on the interposer pins 159.

Figure 6:
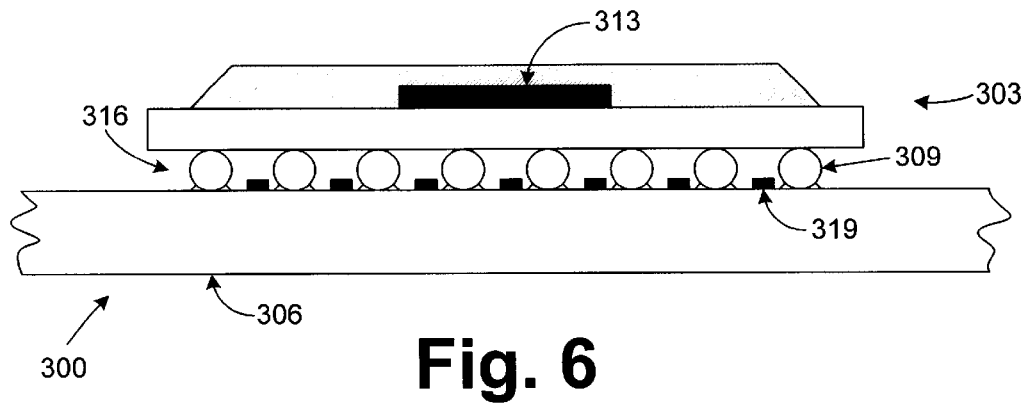
FIG. 6 is a side view of a ball grid array assembly mounted to a printed circuit board with resistors mounted therein.

With reference to FIG. 6, shown is a ball grid array assembly 303 that is attached to a printed circuit board 306 via a number of solder balls 309. Encased within the ball grid array assembly 303 is a processor 313. The solder balls 309 are affixed to pads in a pad array 316 that includes several resistors 319.

Figure 7A:
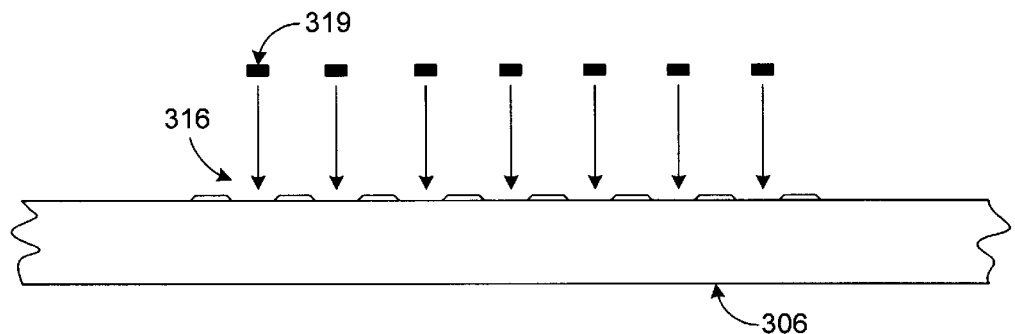
FIG. 7A is an exploded side view of the mounting of the resistors to a pad array on the ball grid array assembly of FIG. 6.
Figure 7B:
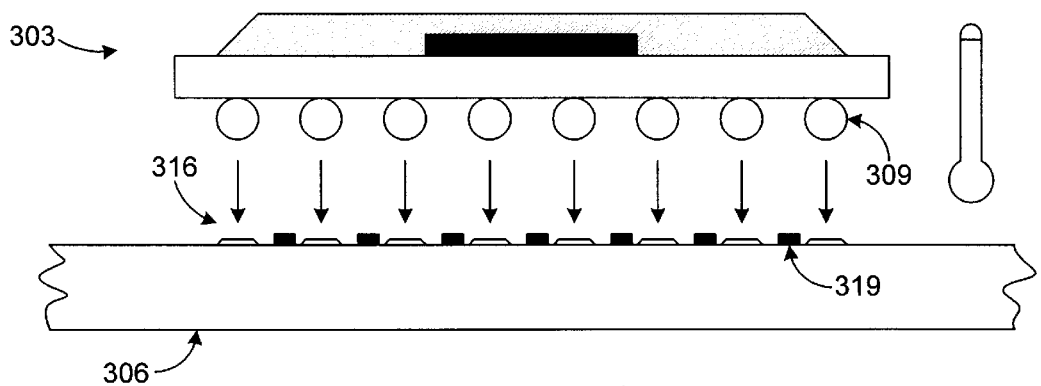
FIG. 7B is an exploded side view of the mounting of the ball grid array assembly to the printed circuit board.

Turning to FIGS. 7A and 7B, shown are steps in a process to construct the ball grid array assembly 303 with the pad array 316 and accompanying resistors 319. The process begins with FIG. 7A in which the resistors 319 are soldered to predetermined points in the pad array 316. Thereafter, as shown in FIG. 7B, the ball grid array assembly 303 is placed against the printed circuit board 306 in such a manner that the solder balls 309 come into contact with the pads in the pad array 316. The resulting assembly is then heated in a solder re-flow furnace and the solder balls 309 flow so as to electrically coupled to the pads of the pad array 316. Thus, the steps of the process illustrated in FIGS. 7A and 7B allow the resistors 319 to be placed within the pad array 316 without disruption or interference with the solder balls 309 during the re-flow process. Note that in an additional step, the resistors 319 may be affixed to the printed circuit board 306 with an adhesive such as epoxy to prevent an occurrence of the tomb stoning effect during the solder re-flow.

Many variations and modifications may be made to the above-described embodiment(s) of the invention without departing substantially from the spirit and principles of the invention. All such modifications and variations are intended to be included herein within the scope of the present invention.

What is claimed is:

1. A process for assembling an interposer socket assembly, comprising the steps of:

mounting a number of resistors onto a number of predetermined positions in a pad array on an interposer board;

inserting a number of interposer pins of a pin socket into the pads of the pad array on the interposer board, wherein the ends of the interposer pins protrude through the interposer board;

placing a solder preform around the ends of the interposer pins; and heating the solder preforms in a solder re-flow oven to solder the interposer pins to the respective pads of the pad array.

2. The process of claim 1, further comprising the step of assembling the pin socket by pressing a number of interposer pins into a corresponding number of holes in the pin socket.

3. The process of claim 1, further comprising the step of attaching a resistor shield over the resistors, the interposer pins protruding through the resistor shield.

4. The process of claim 1, wherein the step of mounting a number of resistors onto a number of predetermined positions in a pad array on an interposer board further comprises soldering the resistors into the predetermined positions in the pad array.

5. The process of claim 1, wherein the step of mounting a number of resistors onto a number of predetermined positions in a pad array on an interposer board further comprises affixing the resistors to the interposer board with an adhesive.

6. A process for assembling a ball grid array assembly on a printed circuit board, comprising the steps of:

mounting a number of resistors onto a number of predetermined positions in a pad array on the printed circuit board;

placing a ball grid array assembly onto the pad array; and heating a number of solder balls on the ball grid array assembly in a solder re-flow oven to solder the ball grid array assembly to the pad array.

7. The process of claim 6, wherein the step of mounting a number of resistors onto a number of predetermined positions in a pad array on the printed circuit board further comprises affixing the resistors to the printed circuit board with an adhesive.

8. An interposer socket assembly, comprising:

an interposer board having a pad array;

a number of resistors mounted onto a number of predetermined positions in the pad array on the interposer board;

a number of interposer pins held in a pin socket, the pins being inserted into the pads of the pad array on the interposer board after the resistors are mounted thereon, wherein the ends of the interposer pins protrude through the interposer board; and the interposer pins being electrically coupled to the pads, respectively by placing a solder preform around the ends of the interposer pins and heating the solder preforms in a solder re-flow oven to cause the solder preforms to flow around a base of the interposer pins.

9. The interposer socket assembly of claim 8, wherein the pin socket is assembled by pressing the interposer pins into a corresponding number of holes in the pin socket.

10. The interposer socket assembly of claim 8, further comprising a resistor shield which is attached over the resistors, the interposer pins protruding through the resistor shield.

11. The interposer socket assembly of claim 8, wherein the resistors are mounted onto the predetermined positions in the pad array on the interposer board by soldering the resistors into the predetermined positions in the pad array.

12. The interposer socket assembly of claim 8, wherein the resistors are mounted onto the predetermined positions in the pad array on the interposer board by affixing the resistors to the interposer board with an adhesive.

* * * * *